(12) United States Patent
Lee et al.

(10) Patent No.: US 10,095,122 B1
(45) Date of Patent: Oct. 9, 2018

(54) SYSTEMS AND METHODS FOR FABRICATING METROLOGY TARGETS WITH SUB-RESOLUTION FEATURES

(71) Applicant: KLA-Tencor Corporation, Milpitas, CA (US)

(72) Inventors: Myungjun Lee, San Jose, CA (US); Mark D. Smith, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/289,590

(22) Filed: Oct. 10, 2016

Related U.S. Application Data

(60) Provisional application No. 62/356,745, filed on Jun. 30, 2016.

(51) Int. Cl.
| | | |
|---|---|---|
| G03B 27/42 | (2006.01) | |
| G03F 7/20 | (2006.01) | |
| G03F 1/76 | (2012.01) | |
| G03F 1/44 | (2012.01) | |

(52) U.S. Cl.
CPC ............ *G03F 7/70633* (2013.01); *G03F 1/44* (2013.01); *G03F 1/76* (2013.01); *G03F 7/70058* (2013.01)

(58) Field of Classification Search
CPC ............ G03F 7/70558; G03F 7/70641; G03F 7/70625; G03F 7/70633
USPC .................. 355/52, 53, 55; 356/399–401
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |
| 6,429,943 B1 | 8/2002 | Opsal et al. |
| 6,985,618 B2 | 1/2006 | Adel et al. |
| 7,408,642 B1 | 8/2008 | DiBiase |
| 7,478,019 B2 | 1/2009 | Langooie et al. |
| 7,667,842 B2 | 2/2010 | Schulz |

(Continued)

FOREIGN PATENT DOCUMENTS

| | | |
|---|---|---|
| WO | 2014062972 A1 | 4/2014 |
| WO | 2016172122 A1 | 10/2016 |

OTHER PUBLICATIONS

U.S. Appl. No. 14/294,540, filed Jun. 3, 2014, P. Jiang et al.

(Continued)

*Primary Examiner* — Hung Henry Nguyen
(74) *Attorney, Agent, or Firm* — Suiter Swantz pc llo

(57) ABSTRACT

A lithography system includes an illumination source, a pattern mask, and an optical element configured to expose a sample with an image of the pattern mask for the fabrication of one or more printed device structures and one or more metrology target structures. The pattern mask includes a device pattern mask area and a metrology target pattern mask area. The device pattern mask area includes a set of device pattern elements distributed with a device pitch. The metrology target pattern mask area includes a set of metrology target pattern elements. The one or more printed metrology target structures include a set of metrology target elements distributed with a metrology target pitch. Regions of the metrology target pattern mask area include sub-resolution features having widths smaller than the resolution of the optical element such that the sub-resolution pattern elements are not included on the one or more printed metrology target structures.

18 Claims, 14 Drawing Sheets

(56) References Cited

U.S. PATENT DOCUMENTS

| | | |
|---|---|---|
| 7,925,486 B2 | 4/2011 | Smith et al. |
| 7,933,026 B2 | 4/2011 | Opsal et al. |
| 8,214,771 B2 | 7/2012 | Adel et al. |
| 8,930,156 B2 | 1/2015 | Adel et al. |
| 9,581,430 B2 | 2/2017 | Manassen et al. |
| 2013/0042089 A1 | 2/2013 | Vinh et al. |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0257734 A1 | 9/2014 | Bringoltz et al. |
| 2015/0204664 A1 | 7/2015 | Bringoltz et al. |
| 2016/0061589 A1* | 3/2016 | Bhattacharyya ....... G01B 11/14 356/620 |
| 2016/0216197 A1 | 7/2016 | Bringoltz et al. |
| 2017/0090302 A1* | 3/2017 | Slotboom ........... G03F 7/70625 |

OTHER PUBLICATIONS

Philippe Leray et al., Overlay metrology solutions in a triple patterning scheme, Metrology, Inspection, and Process Control for Microlithography XXIX, Proc. of SPIE, vol. 9424, Mar. 2015, 8 pages.

Lee et al., Metrology target design (MID) solution for diagonally orientated DRAM layer, Metrology, Inspection, and Process Control for Microlithography XXX, Proc. of SPIE, vol. 9778, Mar. 8, 2016, 14 pages.

Lee et al., Lithography-aware overlay metrology target design method, Metrology, Inspection, and Process Control for Microlithography XXX, Proc. of SPIE, vol. 9778, Mar. 24, 2016, 14 pages.

Lee et al., Highly Sensitive focus monitoring technique based on illumination and target co-optimization, SPIE Advanced Lithography, Proc. SPIE, vol. 9778, Mar. 24, 2016, 10 pages.

* cited by examiner

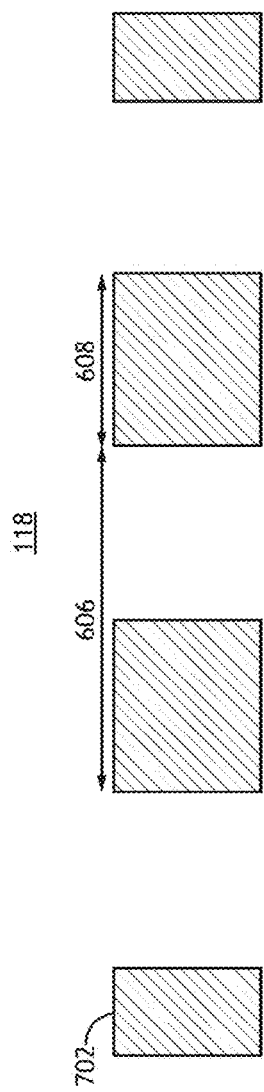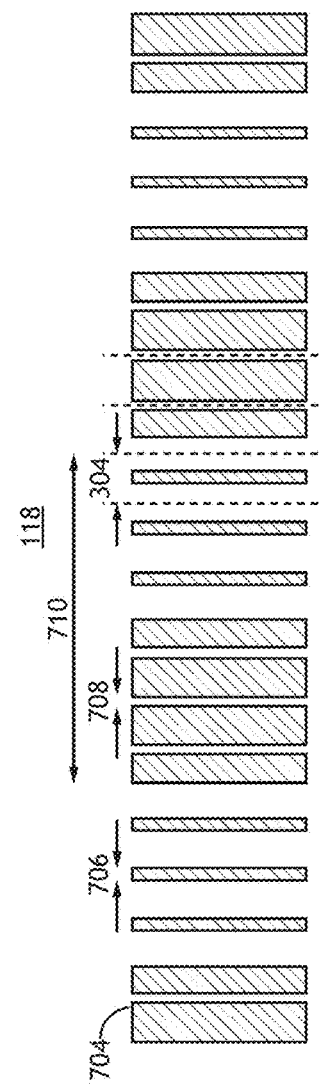

SYSTEMS AND METHODS FOR FABRICATING METROLOGY TARGETS WITH SUB-RESOLUTION FEATURES

CROSS-REFERENCE TO RELATED APPLICATION

The present application claims the benefit under 35 U.S.C. § 119(e) of U.S. Provisional Application Ser. No. 62/365,745, filed Jun. 30, 2016, entitled SUB-RESOLUTION ASSIST FEATURE ENGINEERING FOR DESIGNING METROLOGY TARGETS TO REDUCE PPE BIAS, naming Myungjun Lee and Mark D. Smith as inventors, which is incorporated herein by reference in the entirety.

TECHNICAL FIELD

The present invention relates generally to metrology, and more particularly, to metrology target pattern masks having sub-resolution features.

BACKGROUND

Metrology targets included on a layer of a semiconductor fabrication process typically serve as a proxy for all structures fabricated on the layer such that printing characteristics (e.g. overlay, critical dimension, or the like) may be measured on the metrology target to diagnose the quality of the fabrication process for the entire layer. Further, many types of metrology targets may be designed to enable highly precise measurements of specific printing characteristics. However, as the demands for small structure size and high structure density increase, differences in the layouts of metrology targets with respect to other structures on the layer may result in a metrology target being fabricated with different printing characteristics than the other structures on the layer, which may decrease the accuracy and reliability of the metrology targets. Therefore, it would be desirable to provide a system and method for curing defects such as those identified above.

SUMMARY

A lithography system is disclosed, in accordance with one or more illustrative embodiments of the present disclosure. In one illustrative embodiment, the system includes an illumination source. In another illustrative embodiment, the system includes a pattern mask to be illuminated by the illumination source. In another illustrative embodiment, the pattern mask includes a device pattern mask area and a metrology target pattern mask area. In another illustrative embodiment, the device pattern mask area includes a set of device pattern elements distributed with a device pitch. In another illustrative embodiment, the metrology target pattern mask area includes a set of metrology target pattern elements. In another illustrative embodiment, the system includes an optical element to expose a sample with an image of the pattern mask for the fabrication of one or more printed device structures based on the set of device pattern elements and one or more printed metrology target structures based on the set of metrology target pattern elements. In another illustrative embodiment, the one or more printed metrology target structures include a set of metrology target elements distributed with a metrology target pitch different than the device pitch. In another illustrative embodiment, regions of the metrology target pattern mask area corresponding to the one or more printed metrology target structures include metrology target pattern elements separated by sub-resolution gaps smaller than a resolution of the optical element such that the sub-resolution gaps are not included on the one or more printed metrology target structures. In another illustrative embodiment, regions of the metrology target pattern mask area corresponding to spaces between the one or more printed metrology target structures include sub-resolution pattern elements having widths smaller than the resolution of the optical element such that the sub-resolution pattern elements are not included on the one or more printed metrology target structures.

A lithography pattern mask is disclosed, in accordance with one or more illustrative embodiments of the present disclosure. In one illustrative embodiment, the pattern mask includes a device pattern mask area. In another illustrative embodiment, the device pattern mask area includes a set of device pattern elements distributed with a device pitch. In another illustrative embodiment, the mask includes a metrology target pattern mask area. In another illustrative embodiment, the metrology target pattern mask area includes a set of metrology target pattern elements. In another illustrative embodiment, the device pattern mask area and the metrology target pattern mask area are configured to be illuminated by an illumination source and imaged by a set of optical elements onto a sample for the fabrication of one or more printed device structures and one or more metrology target structures. In another illustrative embodiment, the one or more printed metrology target structures include a set of metrology target elements distributed with a metrology target pitch. In another illustrative embodiment, regions of the metrology target pattern mask area corresponding to the one or more printed metrology target structures include metrology target pattern elements distributed with the device pitch separated by sub-resolution gaps smaller than a resolution of the set of optical elements such that the sub-resolution gaps are not included on the one or more printed metrology target structures. In another illustrative embodiment, regions of the metrology target pattern mask area corresponding to spaces between the one or more printed metrology target structures include sub-resolution pattern elements having a width smaller than the resolution of the set of optical elements such that the sub-resolution pattern elements are not included on the one or more printed metrology target structures.

A method for designing a pattern mask is disclosed, in accordance with one or more illustrative embodiments of the present disclosure. In one illustrative embodiment, the method includes receiving a set of device structures to be fabricated. In another illustrative embodiment, at least a portion of the set of device structures are distributed with a device pitch. In another illustrative embodiment, the method includes generating one or more device pattern elements of a pattern mask to be imaged onto a sample by a lithography tool. In another illustrative embodiment, the method includes determining an illumination profile of an illumination source of the lithography tool. In another illustrative embodiment, the method includes defining a set of metrology structures to be fabricated on the sample with the set of device structures. In another illustrative embodiment, the method includes generating a metrology target pattern layout including one or more metrology target pattern elements. In another illustrative embodiment, the pattern mask includes the metrology target pattern layout. In another illustrative embodiment, at least a portion of the one or more metrology target pattern elements include sub-resolution features. In another illustrative embodiment, the sub-resolution features include at least one dimension smaller than an optical resolution of the lithography tool. In another illustrative embodiment, the sub-resolution features are not included in an image of the one or more metrology target pattern elements on the sample. In another illustrative embodiment, the image of the one or more metrology target pattern elements on the sample corresponds to the set of metrology structures.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 7A is a top view of a portion of a typical pattern mask including metrology target pattern elements for the fabrication of metrology structures illustrated in FIG. 6 on a sample, in accordance with one or more embodiments of the present disclosure.

FIG. 7B is a top view of a portion of a typical pattern mask including metrology target pattern elements with sub-resolution features for the fabrication of metrology structures illustrated in FIG. 6 on a sample, in accordance with one or more embodiments of the present disclosure.

DETAILED DESCRIPTION

Figure 1A:
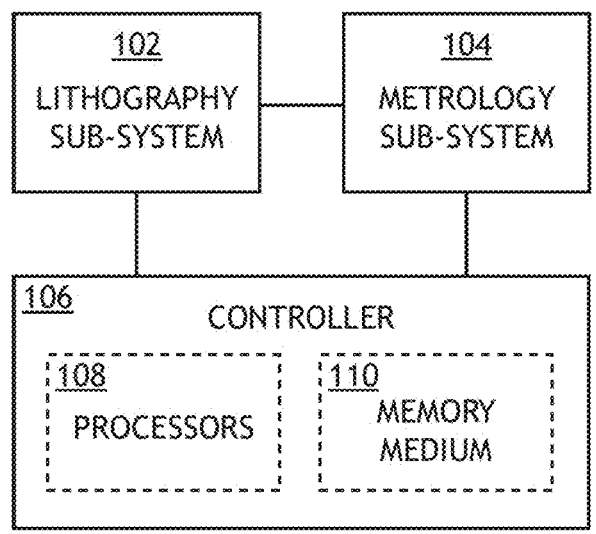
FIG. 1A is a conceptual view illustrating a semiconductor device system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Referring generally to FIGS. 1A through 9C, embodiments of the present disclosure are directed to lithographic pattern masks including pattern elements for both device structures (e.g. structures associated with a device being fabricated) and metrology target structures (e.g. structures associated with metrology targets) having sub-resolution features distributed with a pitch corresponding to the pitch of device structures. Additional embodiments of the present disclosure are directed to metrology target structures having different physical characteristics (e.g. pitch, size, orientation, density, or the like) than device structures. For example, the size, orientation, and/or distribution of metrology target structures may be selected based on simulations of metrology target performance. In this regard, sub-resolution features may mitigate differences between diffraction patterns (e.g. pupil plane distributions within a lithography tool, or the like) of device pattern elements and metrology target pattern elements. Further, sub-resolution features may mitigate differences between the sensitivities of device pattern elements and metrology target pattern elements to aberrations during lithography.

A semiconductor device may typically be formed as one or more printed layers (e.g. fabricated layers, or the like) of patterned material. Each printed layer may be fabricated through a series of process steps such as, but not limited to, material deposition steps, lithography steps, or etching steps. For example, a typical lithography/etch fabrication step may include exposing a sample with an image of a pattern mask to induce a chemical change within the exposed portions of the sample, followed by an etch step in which portions of the sample (e.g. either exposed or unexposed portions of the sample) are removed to leave behind a desired pattern. Further, each printed layer must be fabricated within specific tolerances to properly construct the final device. For example, printing characteristics such as, but not limited to, the linewidths, sidewall angles, and relative placement of device structures in each layer must be well characterized and controlled. Accordingly, metrology targets may be fabricated on one or more layers to serve as proxies of device structures. In this regard, metrology targets may be designed to facilitate accurate measurement of printing characteristics. For example, an overlay metrology target designed to facilitate a measurement of misalignment between two or more layers of a semiconductor device may include an open square feature on a first layer and a smaller square feature on a second layer that is ideally centered in the open square feature of the first layer (e.g. a box-in-box overlay target). A misalignment of the layers may then be measurable as a deviation of the position of the smaller square feature within the open square feature.

It is generally desirable that printed structures of a metrology target on a given layer print with the same characteristics (e.g. pattern placement error (PPE), sidewall angle, critical dimensions, layer thickness, or the like) as printed device structures of that layer. In this regard, printing characteristics of a metrology target may be used as a proxy for the printing characteristics of the entire printed layer. However, the degree to which characteristics of a printed feature are robust to deviations of process parameters may depend on a variety of factors. For example, robustness to deviations of process parameters may be influenced by characteristics of the desired pattern features such as, but not limited to, the dimensions and/or the density of the desired printed features. Additionally, robustness to deviations of process parameters may be influenced by optical characteristics of the lithography tool such as, but not limited to, the depth of focus (DOF), the numerical aperture (NA) of projection optics, the shape of the illumination source, the symmetry of the illumination source, the spectral content of the illumination source, or coherence of the illumination source. Further, robustness to deviations of process parameters may be influenced by characteristics of the pattern mask imaged onto the sample to generate the printed patterns such as, but not limited to, the transmission of pattern elements, the optical phase induced by the pattern elements, or the dimensions of pattern elements with respect to the resolution of the projection optics. Further, many such characteristics associated with the robustness of printed parameters may be interdependent. Embodiments of the present disclosure are directed to metrology target pattern masks designed to provide printed metrology targets with printing characteristics corresponding to those of device structures on a common layer. Additional embodiments are directed to metrology target pattern mask elements having a diffraction pattern corresponding to a diffraction pattern of device structures on a common layer.

As used throughout the present disclosure, the term "sample" generally refers to a substrate formed of a semiconductor or non-semiconductor material (e.g. a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

Referring generally to FIGS. 1A through 1D, a semiconductor device fabrication system is disclosed. FIG. 1A is a conceptual view illustrating a semiconductor device fabrication system 100, in accordance with one or more embodiments of the present disclosure. In one embodiment, the system 100 includes a lithography sub-system 102 for lithographically printing one or more patterns (e.g. metrology target patterns, or the like) to a sample, in accordance with one or more embodiments of the present disclosure. The lithography sub-system 102 may include any lithographic printing tool known in the art. For example, the lithography sub-system 102 may include, but is not limited to, a scanner or stepper. In another embodiment, the system 100 includes a metrology sub-system 104 to characterize one or more printed patterns on the sample. For example, the metrology sub-system 104 may measure any metrology metric (e.g. overlay error, CD, sidewall angle, or the like) using any method known in the art. In one embodiment, the metrology sub-system 104 includes an image-based metrology tool to measure metrology data based on the generation of one or more images of the sample 122. In another embodiment, the metrology sub-system 104 includes a scatterometry-based metrology system to measure metrology data based on the scattering (reflection, diffraction, diffuse scattering, or the like) of light from the sample.

In another embodiment, the system 100 includes a controller 106. In another embodiment, the controller 106 includes one or more processors 108 configured to execute program instructions maintained on a memory medium 110. In this regard, the one or more processors 108 of controller 106 may execute any of the various process steps described throughout the present disclosure. Further, the controller 106 may be communicatively coupled to the mask support device 116 and/or the sample stage 124 to direct the transfer of pattern elements on a pattern mask 118 to a sample 122 (e.g. a resist layer 126 on the sample, or the like). It is noted herein that the lithography sub-system 102 of the present invention may implement any of the pattern mask designs described throughout the present disclosure. Lee et al. generally describe mask-based lithography in U.S. Pat. No. 7,545,520, issued on Jun. 9, 2009, which is incorporated herein in the entirety.

The metrology sub-system 104 may provide various types of measurements related to semiconductor manufacturing. For example, the metrology sub-system 104 may provide one or more metrology metrics of one or more metrology targets such as, but not limited to, critical dimensions, overlay, sidewall angles, film thicknesses, or process-related parameters (e.g., focal position of the sample 122 during a lithography step, an exposure dose of illumination during a lithography step, or the like).

Figure 1B:
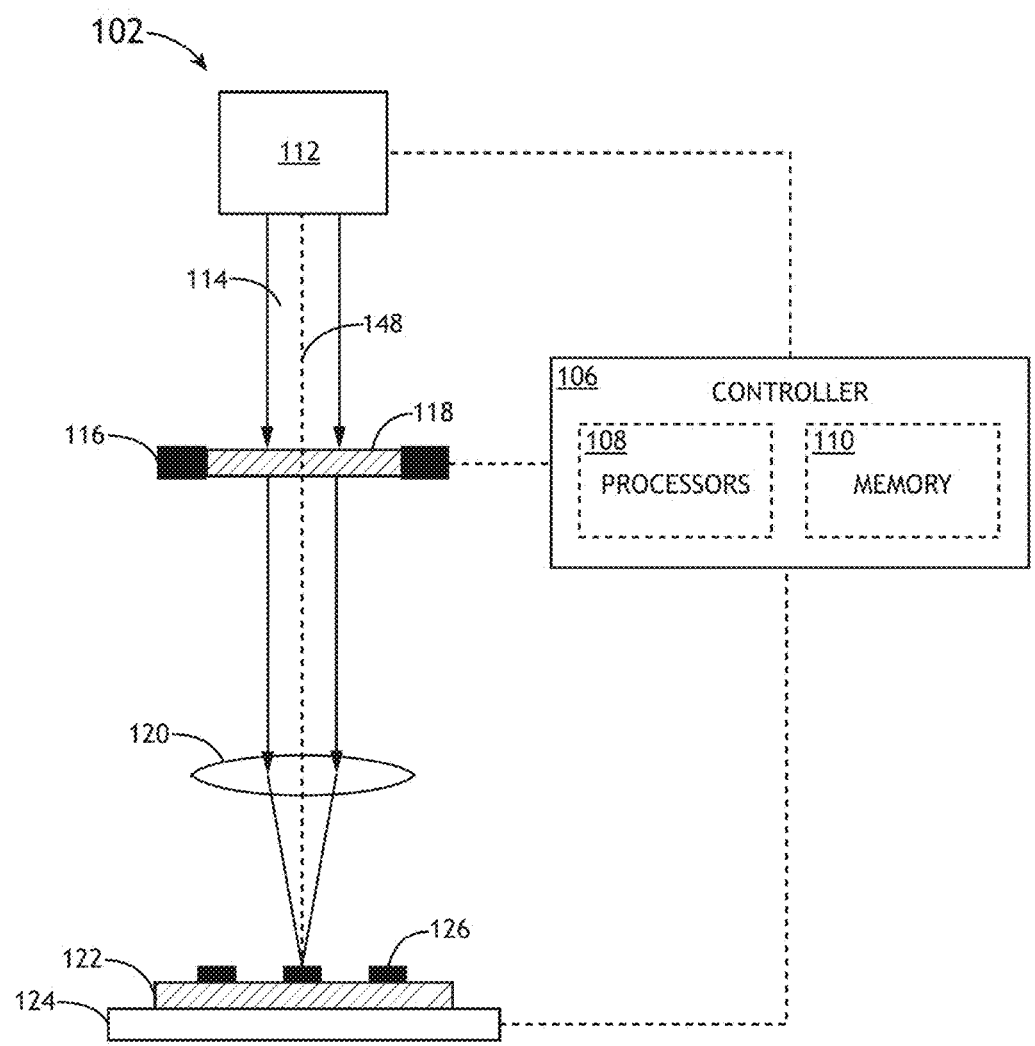
FIG. 1B is a conceptual view illustrating a lithography sub-system, in accordance with one or more embodiments of the present disclosure.

FIG. 1B is a conceptual view illustrating the lithography sub-system 102, in accordance with one or more embodiments of the present disclosure. In one embodiment, the lithography sub-system 102 includes an illumination source 112 configured to generate one or more illumination beams 114. The one or more illumination beams 114 may include one or more selected wavelengths of light including, but not limited to, ultraviolet (UV) radiation, visible radiation, or infrared (IR) radiation. In another embodiment, the illumination source 112 may generate one or more illumination beams 114 having any pattern known in the art. For example, the illumination source 112 may include, but is not limited to, a single-pole illumination source, a dipole illumination source, a C-Quad illumination source, a Quasar illumination source, or a free-form illumination source.

In another embodiment, the lithography sub-system 102 includes a mask support device 116. The mask support device 116 is configured to secure a pattern mask 118. In another embodiment, the lithography sub-system 102 includes a set of projection optics 120 configured to project an image of the pattern mask 118 illuminated by the one or more illumination beams 114 onto the surface of a sample 122 disposed on a sample stage 124. For example, the set of projection optics 120 may be configured to project an image of the pattern mask 118 onto a resist layer 126 on the sample 122 to generate (e.g. expose, or the like) a printed pattern element (e.g. a metrology pattern) on the resist layer 126 corresponding to a pattern element on the pattern mask 118. In another embodiment, the mask support device 116 may be configured to actuate or position the pattern mask 118. For example, the mask support device 116 may actuate the pattern mask 118 to a selected position with respect to the projection optics 120 of the system 100.

The pattern mask 118 may be utilized (e.g. by lithography sub-system 102) in any imaging configuration known in the art. For example, the pattern mask 118 may be a positive mask (e.g. a bright-field mask) in which pattern elements are positively imaged as printed pattern elements of a resist layer 126 of sample 122. By way of another example, the pattern mask 118 may be a negative mask (e.g. a dark-field mask) in which pattern elements of the pattern mask 118 form negative printed pattern elements (e.g. gaps, spaces, or the like) of a resist layer 126 of sample 122.

Figure 1C:
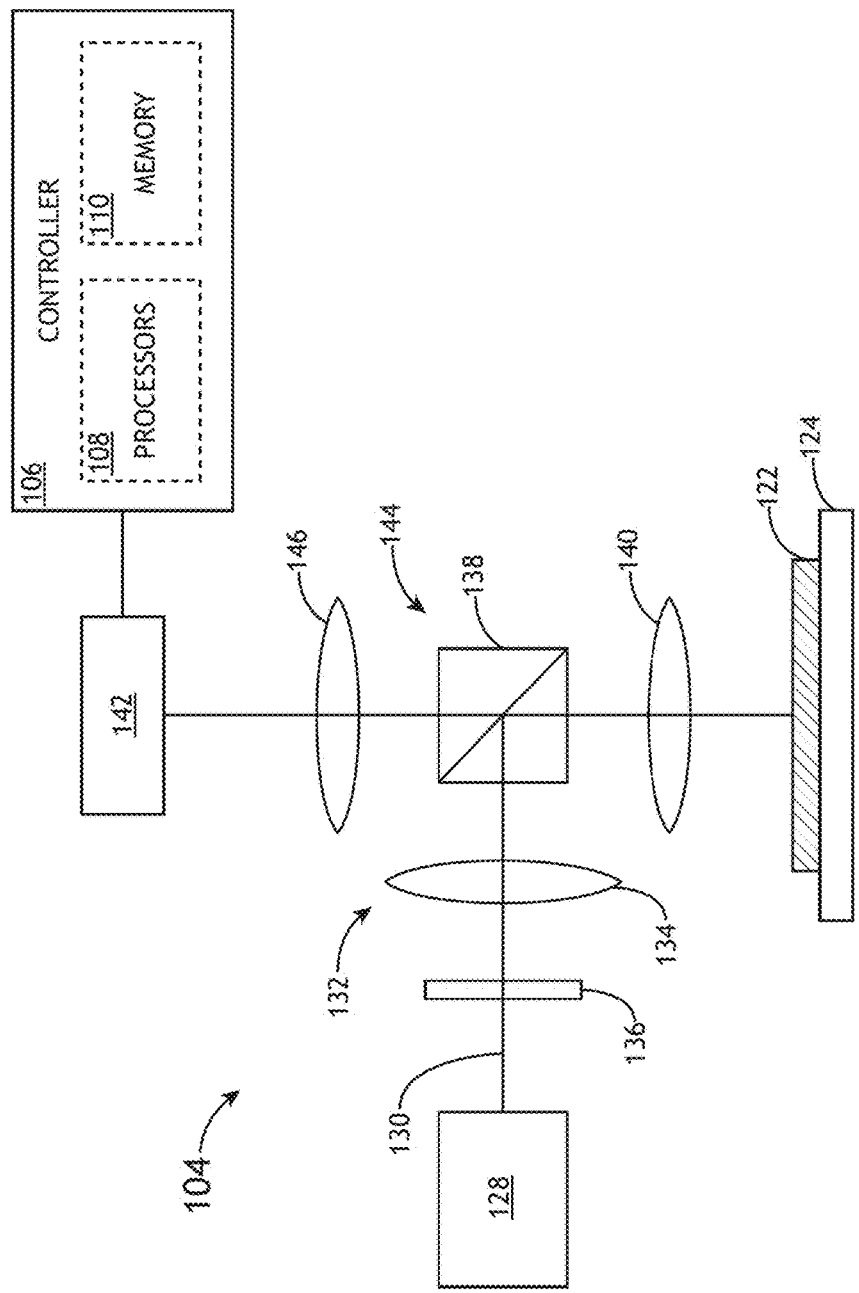
FIG. 1C is a conceptual view illustrating a metrology sub-system, in accordance with one or more embodiments of the present disclosure.

FIG. 1C is a conceptual view illustrating the metrology sub-system 104, in accordance with one or more embodiments of the present disclosure. In one embodiment, the metrology sub-system 104 includes a metrology illumination source 128 to generate a metrology illumination beam 130. In another embodiment, the metrology illumination source 128 is the same as the illumination source 112. In a further embodiment, the metrology illumination source 128 is a separate illumination source configured to generate a separate metrology illumination beam 130. The metrology illumination beam 130 may include one or more selected wavelengths of light including, but not limited to, ultraviolet (UV) radiation, visible radiation, or infrared (IR) radiation.

In another embodiment, the metrology illumination source 128 directs the metrology illumination beam 130 to the sample 122 via an illumination pathway 132. The illumination pathway 132 may include one or more lenses 134. Further, the illumination pathway 132 may include one or more additional optical components 136 suitable for modifying and/or conditioning the metrology illumination beam 130. For example, the one or more optical components 136 may include, but are not limited to, one or more polarizers, one or more filters, one or more beam splitters, one or more diffusers, one or more homogenizers, one or more apodizers, or one or more beam shapers. In one embodiment, the illumination pathway 132 includes a beamsplitter 138. In another embodiment, the metrology sub-system 104 includes an objective lens 140 to focus the metrology illumination beam 130 onto the sample 122.

In another embodiment, the metrology sub-system 104 includes one or more detectors 142 configured to capture radiation emanating from the sample 122 through a collection pathway 144. The collection pathway 144 may include multiple optical elements to direct and/or modify illumination collected by the objective lens 140 including, but not limited to one or more lenses 146, one or more filters, one or more polarizers, one or more beam blocks, or one or more beamsplitters.

For example, a detector 142 may receive an image of the sample 122 provided by elements in the collection pathway 144 (e.g. the objective lens 140, the one or more lenses 146, or the like). By way of another example, a detector 142 may receive radiation reflected or scattered (e.g. via specular reflection, diffuse reflection, and the like) from the sample 122. By way of another example, a detector 142 may receive radiation generated by the sample (e.g. luminescence associated with absorption of the metrology illumination beam 130, and the like). By way of another example, a detector 142 may receive one or more diffracted orders of radiation from the sample 122 (e.g. 0-order diffraction, ±1 order diffraction, ±2 order diffraction, and the like). Further, it is noted herein that the one or more detectors 142 may include any optical detector known in the art suitable for measuring illumination received from the sample 122. For example, a detector 142 may include, but is not limited to, a CCD detector, a TDI detector, a photomultiplier tube (PMT), an avalanche photodiode (APD), or the like. In another embodiment, a detector 142 may include a spectroscopic detector suitable for identifying wavelengths of radiation emanating from the sample 122. Further, the metrology sub-system 104 may include multiple detectors 142 (e.g. associated with multiple beam paths generated by one or more beamsplitters) to facilitate multiple metrology measurements (e.g. multiple metrology tools) by the metrology sub-system 104.

In another embodiment, the metrology sub-system 104 is communicatively coupled to the controller 106 of system 100. In this regard, the controller 106 may be configured to receive data including, but not limited to, metrology data (e.g. metrology measurement results, images of the target, pupil images, and the like) or metrology metrics (e.g. precision, tool-induced shift, sensitivity, diffraction efficiency, through-focus slope, side wall angle, critical dimensions, and the like).

Figure 2:
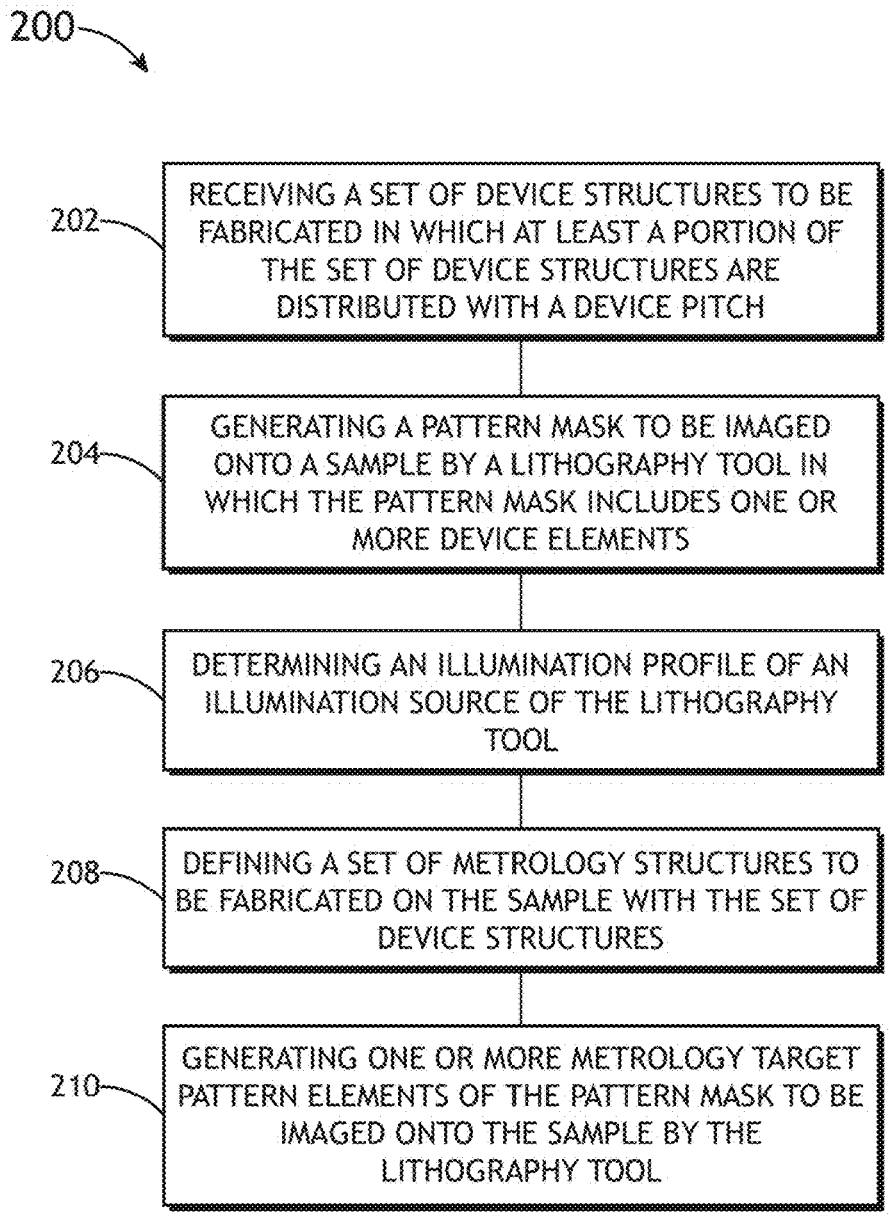
FIG. 2 is a flow diagram illustrating steps performed in a method for designing a pattern mask, in accordance with one or more embodiments of the present disclosure.

FIG. 2 is a flow diagram illustrating steps performed in a method 200 for designing a pattern mask, in accordance with one or more embodiments of the present disclosure. Applicant notes that the embodiments and enabling technologies described previously herein in the context of system 100 should be interpreted to extend to method 200. Each of the steps of the method may be performed as described further herein. The steps may performed by one or more controllers (e.g. controller 106, or the like), which may be configured according to any of the embodiments described herein. In addition, the method described above may be performed by any of the system embodiments described herein. The method may also include one or more additional steps that may be performed by controller or any system embodiments described herein. It is further noted, however, that the method 200 is not limited to the architecture of system 100.

In one embodiment, method 200 includes a step 202 of receiving a set of device structures to be fabricated on a sample in which at least a portion of the set of device structures are distributed with a device pitch. In this regard, the set of device structures includes one or more patterned elements to be fabricated as part of a layer of a semiconductor device. In another embodiment, the set of device structures includes a periodic distribution of structures distributed with the device pitch. In another embodiment, the set of device structures is distributed in a two-dimensional pattern in which at least a portion of the structures are distributed with the device pitch. In a further embodiment, the device pitch may be representative of the distribution of structures on a sample. For example, device structures may be distributed on a sample may include various shapes, sizes, and orientations. Further, devices structures may be arranged in a non-periodic distribution. However, the layout of device structures (e.g. a distribution of device structures, a pattern of device structures, or the like) may include one or more dominant spatial frequencies (e.g. as determined by a Fourier analysis, or the like). Accordingly, a device pitch associated with step 202 may include an inverse of a dominant spatial frequency of the layout of device structures. As such, it may not be necessary for any given structures to be distributed with the precise value of the device pitch.

In another embodiment, method 200 includes a step 204 of generating a pattern mask to be imaged onto a sample by a lithography tool. For example, the pattern mask may include a device pattern mask area including a set of device pattern elements. Accordingly, an image of the set of device pattern elements on the sample may correspond to the set of device structures (e.g. the set of device structures received in step 202). In this regard, a portion of a pattern mask generated in step 204 may include one or more device pattern elements suitable for the fabrication of the desired set of device structures on the sample. By way of another example, the pattern mask may include a metrology target pattern mask area including a set of metrology target pattern elements. Accordingly, an image of the set of metrology target pattern elements may correspond to metrology structures to be printed on the sample. Further, the device structures and/or the metrology target structures may be fabricated on the sample through one or more lithography steps (e.g. via lithography sub-system 102, or the like) in which the sample is exposed to an image of the pattern mask, followed by a subsequent etch step.

Figure 3A:
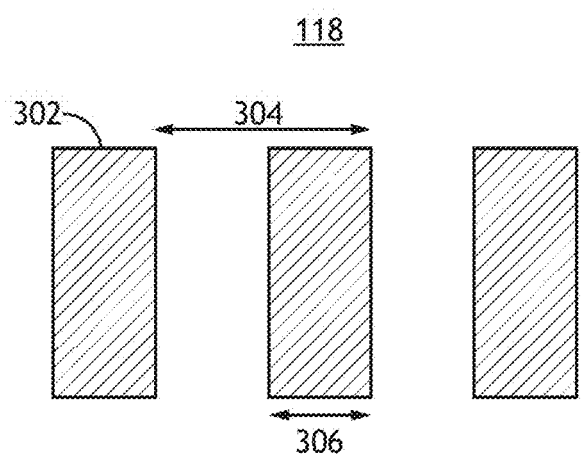
FIG. 3A is a top view of device pattern elements of a pattern mask, in accordance with one or more embodiments of the present disclosure.
Figure 3B:
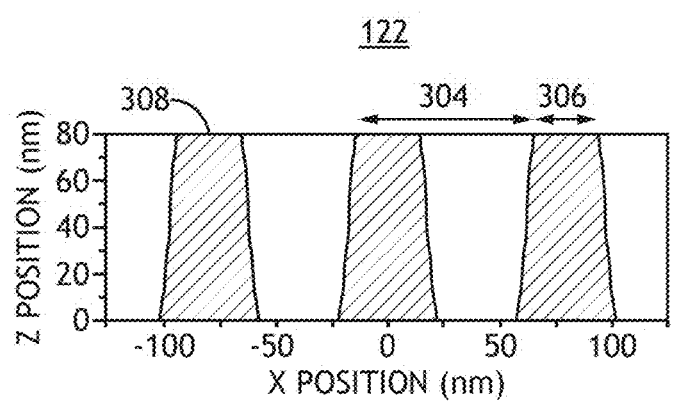
FIG. 3B is a profile view of device structures on a sample, in accordance with one or more embodiments of the present disclosure.

FIG. 3A is a top view of device pattern elements 302 of a pattern mask 118, in accordance with one or more embodiments of the present disclosure. In one embodiment, a pattern mask 118 includes device pattern elements 302 distributed with a device pitch 304 and a device width 306. For example, the device pattern elements 302 illustrated in FIG. 3A may constitute a portion of a pattern mask 118 (e.g. a device pattern mask area, or the like). FIG. 3B is a profile view of device structures 308 on a sample, in accordance with one or more embodiments of the present disclosure. In one embodiment, the distribution of device structures 308 corresponds to an image of the device pattern elements 302 of the pattern mask 118. For example, the device structures 308 may be distributed with the device pitch 308. Further, a critical dimension of the device structures (e.g. a width of the device structures 308 at a particular height on the wafer, or the like) may correspond to the device width 306.

It is to be understood that the particular device pattern elements and device structures illustrated in FIGS. 3A and 3B, along with the associated descriptions are provided solely for illustrative purposes and should not be interpreted as limiting the present disclosure. For example, the device pattern elements and corresponding device structures may include structures with any size, shape, orientation or distribution.

In one embodiment, the layout of the device pattern elements 302 may be established in step 204 in order to achieve a desired layout of device structures 308 on the sample. Accordingly, one or more characteristics of the device pattern elements 302 (e.g. dimensions, spacing, density, or the like) may be designed based on the optical properties of the lithography tool to be used in a lithography step. For example, the layout of the device pattern elements 302 may be tailored to the optical properties of the set of projection optics 120 such as, but not limited to, the resolution or the depth of field.

In another embodiment, the method 200 includes a step 206 of determining an illumination profile of an illumination source of the lithography tool. For example, an illumination source (e.g. illumination source 112) may generate illumination having any pattern or distribution known in the art. In some cases, a profile of the illumination source may be tailored for a particular pattern and/or orientation of device structures to be fabricated (e.g. device structures 308, or the like). As an illustrative example, off-axis illumination may improve the resolution and/or the depth of field relative to on-axis illumination by directing higher-order diffraction orders from the pattern mask to projection optics within a lithography tool (e.g. projection optics 120 of lithography tool 102). Accordingly, an illumination source tailored for printing a periodic series of lines (e.g. a line/space pattern) may include a dipole illumination pattern consisting of two illumination poles separated along the pitch direction of the printed lines (e.g. orthogonal to the printed lines). Additionally, an illumination source tailored for printing two-dimensional structures may include a quadrupole illumination pattern, an annular pattern, or the like to provide off-axis illumination along multiple directions.

Figure 4:
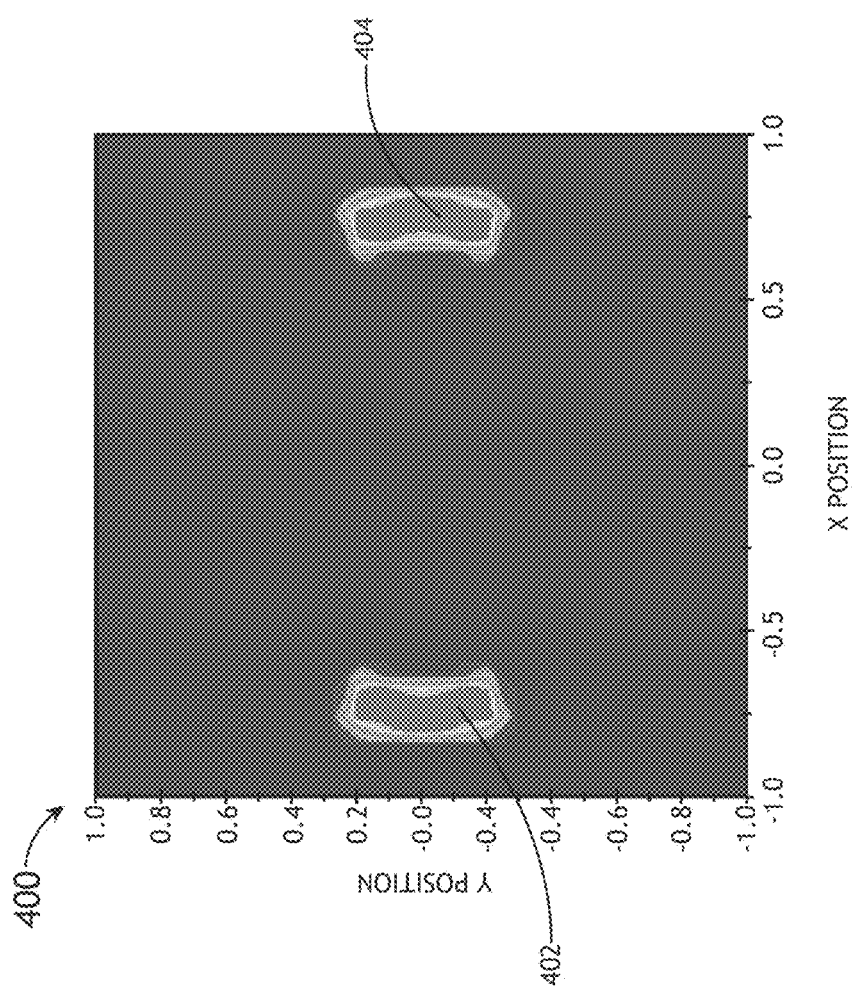
FIG. 4 is a plot of a dipole illumination pattern suitable for illuminating device pattern elements to generate device structures on a sample, in accordance with one or more embodiments of the present disclosure.

FIG. 4 is a plot of a dipole illumination pattern 400 suitable for illuminating the device pattern elements 302 to generate device structures 308 on a sample, in accordance with one or more embodiments of the present disclosure. In one embodiment, the dipole illumination pattern 400 includes a first illumination pole 402 to generate a first illumination beam 114 and a second illumination pole 404 to generate a second illumination beam 114. In another embodiment, the first illumination pole 402 and the second illumination pole 404 are separated along a direction parallel to the device pitch.

The illumination poles of an illumination source (e.g. the first illumination pole 402, the second illumination pole 404, or the like) may have any shape. In one embodiment, as shown in FIG. 3, the illumination poles may be formed as arcs. For example, inner and outer extents of the illumination poles may be formed as portions of a circle centered at the optical axis of the lithography sub-system 102. In another embodiment, the illumination poles may be formed as circles.

In another embodiment, the method 200 includes a step 208 of defining a set of metrology structures to be fabricated on the sample with the set of device structures. For example, step 208 may include selecting a layout of metrology structures in a metrology target on the sample to provide metrology target performance within desired tolerances.

As described previously herein, a metrology target including a set of metrology structures may be fabricated as part of a layer of a semiconductor fabrication process to provide a means for evaluating the quality of the fabrication process. For example, an overlay metrology target may be used to characterize the relative alignment between multiple layers of a semiconductor device. By way of another example, a metrology target may be designed to characterize one or more physical characteristics of fabricated structures (e.g. critical dimensions, sidewall angles, or the like). By way of a further example, metrology targets may be designed to characterize process characteristics (e.g. the location of the sample within the focal volume of the lithography system, the dose of illumination received during exposure, or the like) of a lithography tool used during a lithography step.

Figure 5:
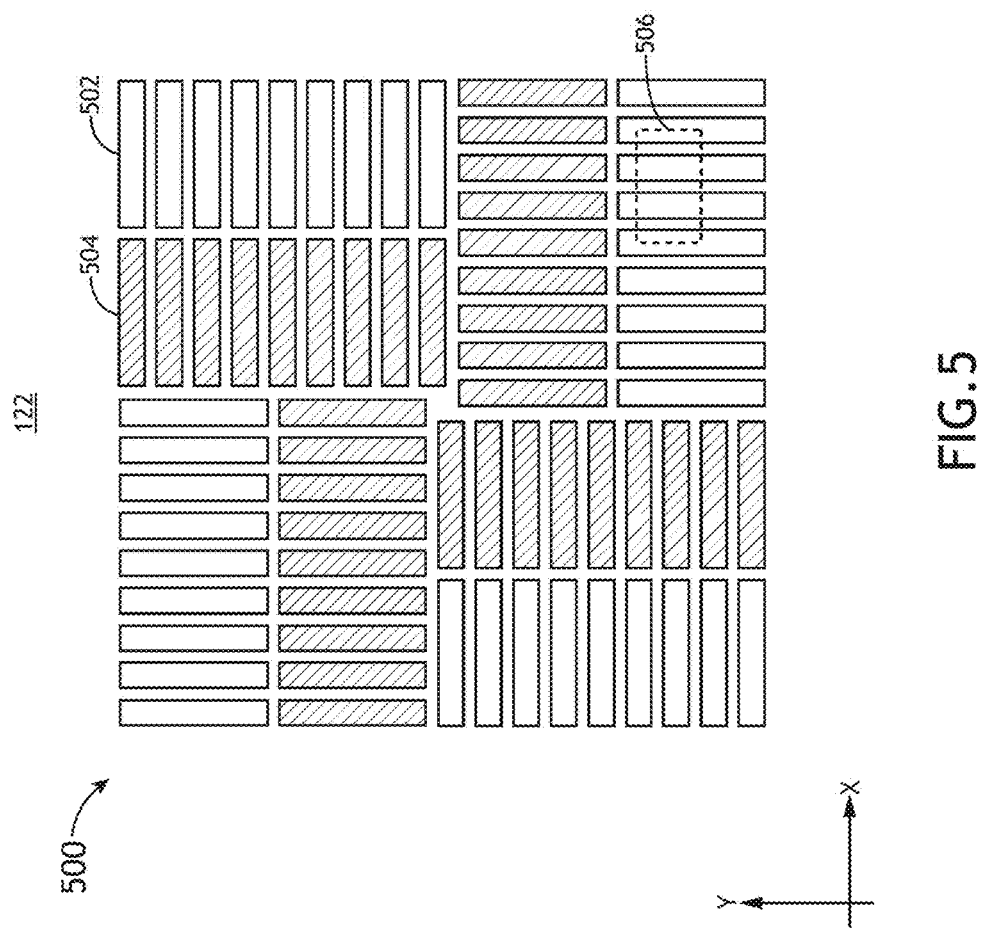
FIG. 5 is a top view of a metrology target on a sample, in accordance with one or more embodiments of the present disclosure.

FIG. 5 is a top view of a metrology target 500 on a sample, in accordance with one or more embodiments of the present disclosure. In one embodiment, metrology target 500 is configured as an overlay metrology target. In another embodiment, metrology target 500 includes a first set of metrology target structures 502 on a first printed layer of the sample 122 and a second set of metrology target structures 504 on a second printed layer of the sample 122. Accordingly, an offset (e.g. PPE) of the second layer relative to the first printed layer may be characterized by measuring the relative positions of the first set of metrology target structures 502 and the second set of metrology target structures 504.

In another embodiment, the metrology target 500 is oriented such that metrology measurements may be made along two orthogonal directions (e.g. the X-direction and the Y-direction of FIG. 5). For example, the first set of metrology target structures 502 and the second set of metrology target structures 504 may include printed elements with edges defined along the X-direction and the Y-direction such that the relative location of the first set of metrology target structures 502 and the second set of metrology target structures 504 along the X-direction and the Y-direction may be readily measured (e.g. by metrology sub-system 104, or the like). In this regard, the measurement directions may serve as a basis to characterize the relative position of the first set of metrology target structures 502 and the second set of metrology target structures 504 along any direction within the plane of the sample 122. Accordingly, the relative positions of the first set of metrology target structures 502 and the second set of metrology target structures 504 along an arbitrary direction within the plane of the sample 122 may be characterized by offsets associated with projected components along the measurement directions.

It is to be understood that the description of an overlay metrology target in FIG. 5 and the associated description is provided solely for illustrative purposes and should not be interpreted as limiting. For example, step 208 may include selecting metrology structures having any shape, size, or distribution. Further, step 208 may include selecting metrology structures associated with any type of metrology target known in the art such as, but not limited to, image-based metrology targets designed to be imaged by a metrology tool (e.g. as shown in FIG. 5), or scatterometry-based metrology targets designed to be characterized according to a diffraction pattern of light incident on the targets.

The performance of a metrology target may be evaluated by any number of different performance metrics. For example, overlay metrology targets may be evaluated based on a sensitivity-to-overlay metric, which may include a derivative of a metrology measurement with respect to actual overlay that may describe the sensitivity of a particular metrology target design to measure small overlay values. By way of another example, a performance metric for a scatterometry overlay metrology target including diffraction gratings on two or more layers may include the diffraction efficiency (e.g. a ratio indicating a relative strength of diffracted orders) of one or more layers of the metrology target. In this regard, the diffraction efficiency may be correlated to spatial noise (e.g. physical imperfections) of the metrology target.

Further, the performance of a particular layout of metrology structures in a metrology target may depend on various factors associated with the sample such as, but not limited to, material parameters (e.g. refractive index, absorption, dispersion, or the like) associated with the layer to be printed, or material parameters associated with any previous layers.

In another embodiment, step 208 includes simulating the performance of multiple metrology targets (e.g. multiple variations of layouts metrology structures having different values of pitch, linewidth, or the like). The simulation of the performance of a metrology target may involve a number of algorithms. For example, optical interaction of an illumination beam with a metrology target on the sample may, but is not limited to, be modeled using an electro-magnetic (EM) solver. Further, the EM solver may utilize any method known in the art including, but not limited to, rigorous coupled-wave analysis (RCWA), finite element method analysis, method of moments analysis, a surface integral technique, a volume integral technique, or a finite-difference time-domain analysis. Additionally, collected data may be analyzed using data fitting and optimization techniques including, but not limited to libraries, fast-reduced-order models, regression, machine-learning algorithms such as neural networks, support-vector machines (SVM), dimensionality-reduction algorithms (e.g. principal component analysis (PCA), independent component analysis (ICA), local-linear embedding (LLE), and the like), sparse representation of data (e.g. Fourier or wavelet transforms, Kalman filters, algorithms to promote matching from same or different tool types, and the like). For example, data collection and/or fitting may be, but is not required to be, performed by the Signal Response Metrology (SRM) software product provided by KLA-TENCOR.

In another embodiment, step 208 includes ranking the performance of multiple metrology targets based on the simulated performance metrics. In another embodiment, step 208 includes selecting a particular metrology target (e.g. a particular set of metrology structures) to provide metrology performance within desired tolerances. For example, the particular metrology target (e.g. the particular layout of metrology structures) may be selected based on the ranking of simulated performance metrics.

Figure 6:
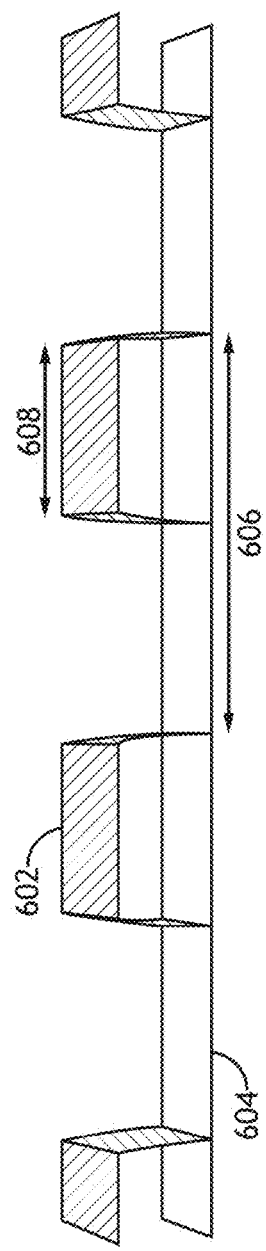
FIG. 6 is a perspective view of a surface profile of simulated metrology structures on a sample, in accordance with one or more embodiments of the present disclosure.

FIG. 6 is a perspective view of a surface profile of simulated metrology structures 602 on a sample 122, in accordance with one or more embodiments of the present disclosure. For example, FIG. 6 may illustrate the surface profile of metrology structures 602 on a surface layer 604 of the sample 122. It is noted that the surface profile of metrology structures 602 is merely an outline and does not include the interior of the metrology structures 602.

In one embodiment, the metrology structures 602 represent a portion 506 of metrology target 500 (see FIG. 5). In another embodiment, metrology structures 602 are distributed with a metrology target pitch 606 and have a metrology target critical dimension 608. For example, the layout of the metrology structures 602 (e.g. the metrology target pitch 606, the metrology target critical dimension 608, or the like) may be selected based on simulations and may provide performance metrics within specified tolerances. Accordingly, the layout of the metrology structures 602 may not correspond to the layout of the device structures 302 such that the metrology target pitch 606 may not be equal to the device pitch and/or the metrology target critical dimension 608 may not be equal to the device critical dimension 304.

In another embodiment, the method includes a step 210 of generating one or more metrology target pattern elements of the pattern mask (e.g. in a metrology target pattern mask area of pattern mask 118) to be imaged onto the sample by the lithography tool such that an image of the metrology target pattern elements corresponds to the layout of the metrology structures 602 (e.g. as selected in step 208).

In one embodiment, a layout of metrology target pattern elements generated in step 210 are designed to print with the same printing characteristics as the device pattern elements 302 such that the fabricated metrology structures (e.g. metrology structures 602) may serve as an accurate proxy for the entire fabricated layer (including the fabricated device structures 308).

FIG. 7A is a top view of a portion of a typical pattern mask including metrology target pattern elements for the fabrication of metrology structures illustrated in FIG. 6 on a sample, in accordance with one or more embodiments of the present disclosure. In one embodiment, an image of the metrology target pattern elements 702 corresponds to the layout of desired metrology target structure 602. In another embodiment, the pattern mask 118 is a positive pattern mask such that metrology target pattern elements 702 correspond to metrology structures 602 fabricated on the sample. For example, metrology target pattern elements 702 may block illumination from the illumination source (e.g. illumination source 112) such that illumination propagates between the metrology target pattern elements to expose the sample. Further, the exposed regions of the sample may be removed in a subsequent step (e.g. an etch step) such that the metrology structures 602 remain on the sample 122. In another embodiment, the layout of the metrology target pattern elements 702 corresponds to the layout of the metrology target structures 602 to be fabricated on the sample 112. For example, metrology target pattern elements 702 may have a pitch equal to the metrology target pitch 606 and a width equal to the metrology target critical dimension 608.

However, as described previously herein, the printing characteristics of structures to be fabricated by a lithography/etching process (e.g. PPE, sidewall angle, critical dimension, or the like) may differ based on the characteristics of the structures to be fabricated as well as optical characteristics of the lithography tool. In this regard, the image of a pattern mask 118 generated on a sample (e.g. by lithography sub-system 102) may differ based on the dimensions and proximity of pattern mask elements within a pattern mask 118. For example, it may be the case that differences between the layout of the device pattern elements 302 and the metrology target pattern elements 602 (e.g. as part of a larger metrology target 500, or the like) may lead to different values of PPE for fabricated device structures 308 and metrology target structures 602, which may reduce the accuracy of a metrology target serving as a proxy for the entire layer.

Further, lithography tools (e.g. lithography sub-system 102) may experience time-varying aberrations that may adversely impact the lithography process. For example, time-varying aberrations may be associated with absorption of energy from the illumination source 102 by elements within the lithography tool (e.g. a chamber, the sample 122, optical elements, the projection optics 120, structural components, or the like). In one instance, absorption of energy from the illumination source 102 may generate temperature variations and thus local refractive index variations in the atmosphere surrounding the sample to generate time-varying aberrations. In another instance, absorption of energy from the illumination source 102 by the projection optics 120 may generate refractive index variations within the projection optics 120 that lead to time-varying aberrations. Additionally, any differences in PPE between device structures 302 and metrology target structures 602 may also be time-varying in response to the time-varying aberrations. In this way, differences in PPE between device structures 302 and metrology target structures 602 may not be compensated with a simple offset.

In one embodiment, metrology target pattern elements may include features with dimensions (e.g. actual dimensions, separations between pattern mask elements, or the like) smaller than a resolution of the lithography sub-system 102 (e.g. the set of projection optics 120) to influence the printing characteristics of features fabricated based on an image of the metrology target pattern elements.

For example, sub-resolution features on pattern mask elements may influence the printing characteristics of fabricated structures on the sample based on optical effects such as scattering, diffraction, and the like. Further, sub-resolution pattern mask elements (alternatively, sub-resolution assist features (SRAFs), sub-resolution inverse features (SRIFs), optical proximity correction (OPC) pattern mask elements, or the like) may influence one or more characteristics of printed elements (e.g. PPE, sidewall angle, critical dimension, or the like) without being resolvably imaged onto the sample 122. Further, sub-resolution pattern mask elements may facilitate the fabrication of robust printed elements on the sample 122 without being resolvably printed.

FIG. 7B is a top view of a portion of a typical pattern mask including metrology target pattern elements 704 with sub-resolution features for the fabrication of metrology structures illustrated in FIG. 6 on a sample, in accordance with one or more embodiments of the present disclosure. In one embodiment, an image of the metrology target pattern elements 704 with sub-resolution features corresponds to the layout of desired metrology target structure 602 and in which the sub-resolution features are not included in the image. In one embodiment, the metrology target pattern elements 704 are distributed with a global pitch 710. For example, the global pitch 710 may, but is not required to, correspond to the metrology target pitch 606. Accordingly, the same metrology target structure 602 may be fabricated using a pattern mask 118 including either metrology target pattern elements 702 or metrology target pattern elements 704.

In one embodiment, a layout of metrology target pattern elements 704 (e.g. within a metrology target pattern mask area of pattern mask 118, or the like) includes regions with resolvable features separated by sub-resolution gaps in which the gap width 708 is designed to be smaller than a resolution of the lithography system 102 (e.g. smaller than a resolution of the projection optics 120). Accordingly, the sub-resolution gap widths 708 may not be included in an image of the pattern mask 118 generated by the lithography sub-system 102 and thus may not be visible on the fabricated metrology target structures 602 (e.g. selected in step 208). However, the sub-resolution gap widths 708 may impact one or more printability characteristics of the metrology target structures 602.

In another embodiment, a layout of metrology target pattern elements 704 (e.g. within a metrology target pattern mask area of pattern mask 118, or the like) includes resolvable gaps and metrology target pattern elements 704 having sub-resolution widths 706 smaller than the resolution of the lithography system 102. Similarly, the sub-resolution widths 708 may not be included in an image of the pattern mask 118 and thus may not be visible on the fabricated metrology target structures 602 (e.g. selected in step 208). However, the sub-resolution widths 708 may impact one or more printability characteristics of the metrology target structures 602.

Sub-resolution features associated with the layout of metrology target pattern elements may be distributed in any pattern known in the art such that the printing characteristics of the metrology target structures (e.g. metrology target structures 602, or the like) and device structures (e.g. device structures 308) may be fabricated with corresponding printing characteristics. It is noted herein that printing characteristics of metrology target structures need not be exactly the same as printing characteristics of device structures. Rather, sub-resolution features may bring the difference between printing characteristics of metrology target structures and device structures to within a specified tolerance.

In one embodiment, the separation between sub-resolution features (e.g. sub-resolution widths 706, sub-resolution gap widths 708 or the like) may be varied to achieve desired printing characteristics (e.g. to tailor the metrology target critical dimension 608, mitigate critical dimension bias, or the like). In another embodiment, the layout of metrology target pattern elements 704 may include a fixed grid width associated with a separation between sub-resolution features. For example, as illustrated in FIG. 7B, the fixed grid width may be, but is not required to be, equal to the device pitch 304. In this regard, the layout of metrology target pattern elements 704 may include a spatial frequency corresponding to a spatial frequency of the device pattern elements.

In one embodiment, step 710 includes simulating the sensitivity of device pattern elements as well as variations candidate layouts of metrology target pattern elements including sub-resolution features to various aberrations during a lithography step. For example, step 710 may include simulating one or more aspects of a lithography step (e.g. exposure, printing, or the like) for the various metrology target layouts. Further, candidate metrology target layouts may include variations of a spacing between sub-resolution features, varying sub-resolution widths (e.g. sub-resolution widths 706, or the like), and/or varying sub-resolution gap widths (e.g. sub-resolution gap widths 708, or the like).

An aberration sensitivity analysis carried out in step 710 may include any type of sensitivity analysis known in the art. For example, an aberration sensitivity analysis may include a Monte Carlo analysis. By way of another example, an aberration sensitivity analysis may include a Zernike polynomial analysis. In this regard, a response to aberrations (e.g. of the set of projection optics 120, or the like) may be characterized by numerical values of 36 Zernike coefficients. Accordingly, any complex aberration may be expressed as a combination of Zernike polynomial terms. In one instance, the PPE associated with an aberration may be expressed as a combination of PPE without aberration, PPE(Z=0), and PPE associated with each Zernike coefficient, PPE($Z_i$) where $Z_i$ corresponds to the Zernike coefficients for i=1 . . . 36 according to the following equation:

$$PPE(Z) \cong -PPE(Z=0) + \Sigma PPE(Z_i). \quad (1)$$

The value of i may be selected to include any subset of Zernike coefficients. For example, the value of i may be selected to range from 4 to 36 to exclude Zernike coefficients associated with piston, the tilt of the sample 122, or the like, which may be otherwise corrected for.

Simulations of metrology target layouts may be carried out using any technique known in the art. For example, PROLITH simulations may be, but is not required to be, used to build lithography models for the device as well as candidate metrology target layouts. Further, the PROLITH programming interface (PPI) with MATLAB may be, but is not required to be, used for Zernike sensitivity and Monte Carlo analysis.

In another embodiment, step 710 includes calculating a difference between the sensitivity of the device pattern elements and each of the candidate layouts of metrology target pattern elements. In another embodiment, step 710 includes determining a particular layout of metrology target pattern elements having sub-resolution features based on the sensitivity analysis. In this regard, the device pattern elements and the selected layout of metrology target pattern elements may respond to aberrations in a similar manner. Accordingly, the device structures and metrology structures fabricated based on the selected layout of metrology target pattern elements may be fabricated with similar PPE, even under conditions of time-varying aberrations. As such, the metrology target structures may accurately provide a proxy for the printing characteristics of the entire layer.

Continuing the example of a Zernike sensitivity analysis above, the difference between the sensitivities of the device pattern elements and the metrology target pattern elements may be evaluated using a cost function such as:

$$\Sigma_{k=i}\sqrt[n]{(PPE_D(Z_i) - PPE_T(Z_i))^2}. \quad (2)$$

for i=4 . . . 36, where $PPE_D$ represents PPE associated with device pattern elements and $PPE_T$ represents PPE associated with metrology target pattern elements. In this regard, step 210 may include determining the particular layout of metrology target pattern elements having sub-resolution features that is associated with the lowest value of the cost function.

In another embodiment, step 710 includes ranking simulated metrology target layouts. For example, the simulated metrology target layouts may be ranked according to a variety of factors including, but not limited to, the cost function (e.g. as defined by equation 2, or the like), the integrity and/or robustness of printed features (e.g. associated with sidewall angles, structure heights, or the like, the required process window (e.g. robustness to depth of field, exposure received by the illumination source, or the like), or metrology performance of the printed metrology target.

Any or all steps of method 200 may be integrated into metrology target design processes. For example, steps of method 200 may provide multiple candidate metrology target layouts with different segmentation alternatives. In this regard, a detailed simulation of each candidate metrology target layout may be defined and design permutations may be analyzed through an analysis of printing characteristics (e.g. PPE as described above) as a function of process conditions such as, but not limited to, optical aberrations in the lithography tool. Further, a subset of potential metrology target layouts may be subsequently sent to a second metrology simulation step which quantifies and ranks the remaining contenders. In one embodiment, simulations of various aspects of the lithographic printing of metrology target layouts (e.g. as a part of step 210 described above, or the like) may be performed in parallel with simulations of metrology performance (e.g. as a part of step 208 described above). In another embodiment, a subset of the potential metrology target layouts ranked highly by metrology simulations (e.g. in step 208) may be used as input for the PPE analysis (e.g. in step 210).

It is noted herein that a metrology target designed based on any or all steps of method 200 may provide robust performance in a wide range of lithographic conditions. For example, designing the characteristics of a printed target to provide metrology performance within desired specifications (e.g. as a part of step 208, or the like) may ensure that the metrology target, when properly printed, meets a desired performance standard. Further, designing a pattern mask with sub-resolution features (e.g. as a part of step 210, or the like) such that the metrology target pattern elements have the same or substantially similar sensitivity to lithographic conditions may ensure that metrology target is properly printed under a wide range of lithographic conditions, including time-varying aberrations.

Figure 8:
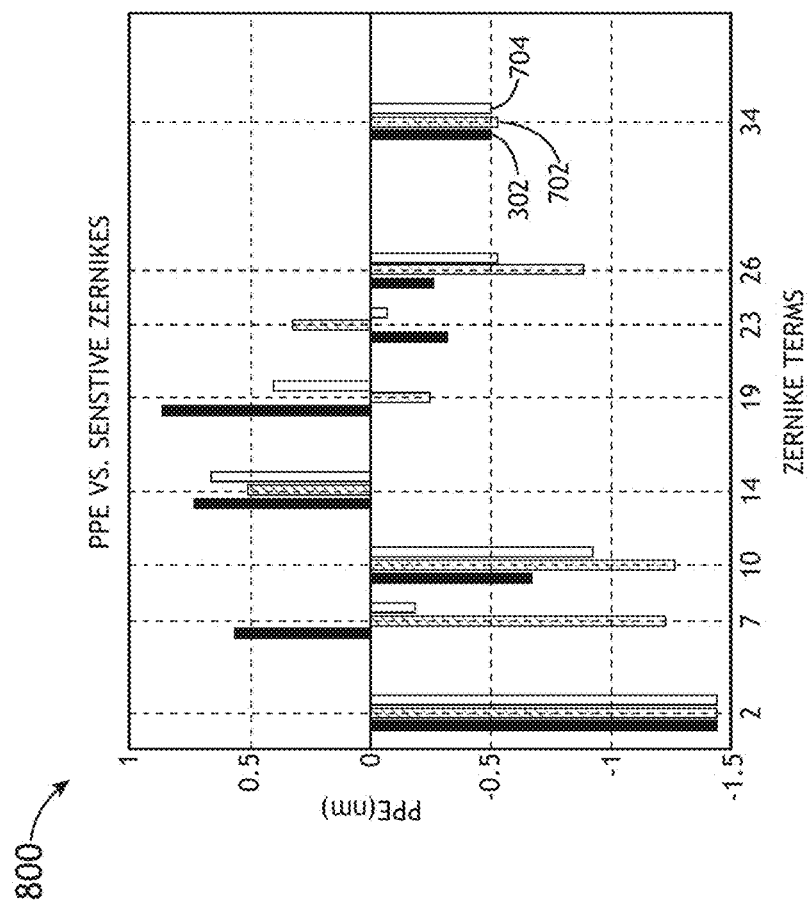
FIG. 8 is a plot of pattern placement error as a function of Zernike coefficients for the device pattern elements, a first exemplary layout of metrology target pattern elements, and a second exemplary layout of metrology target pattern elements, in accordance with one or more embodiments of the present disclosure.
Figure 9A:
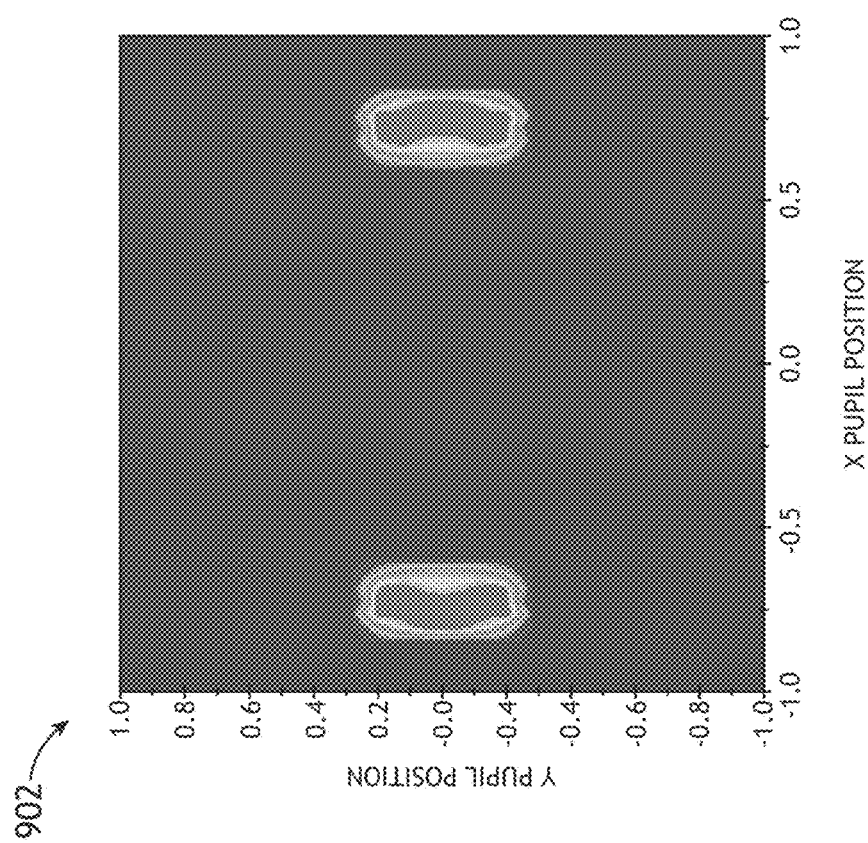
FIG. 9A is a plot illustrating a diffraction pattern in a pupil plane of device pattern elements, in accordance with one or more embodiments of the present disclosure.
Figure 9B:
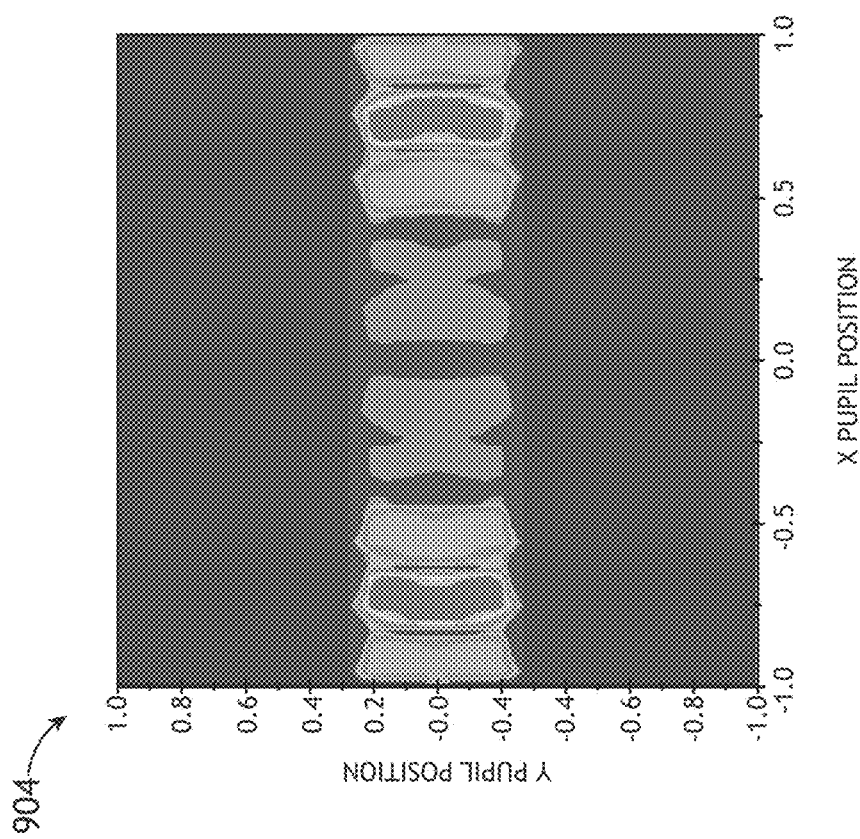
FIG. 9B is a plot illustrating the diffraction pattern in a pupil plane of an exemplary layout of metrology target pattern elements, in accordance with one or more embodiments of the present disclosure.
Figure 9C:
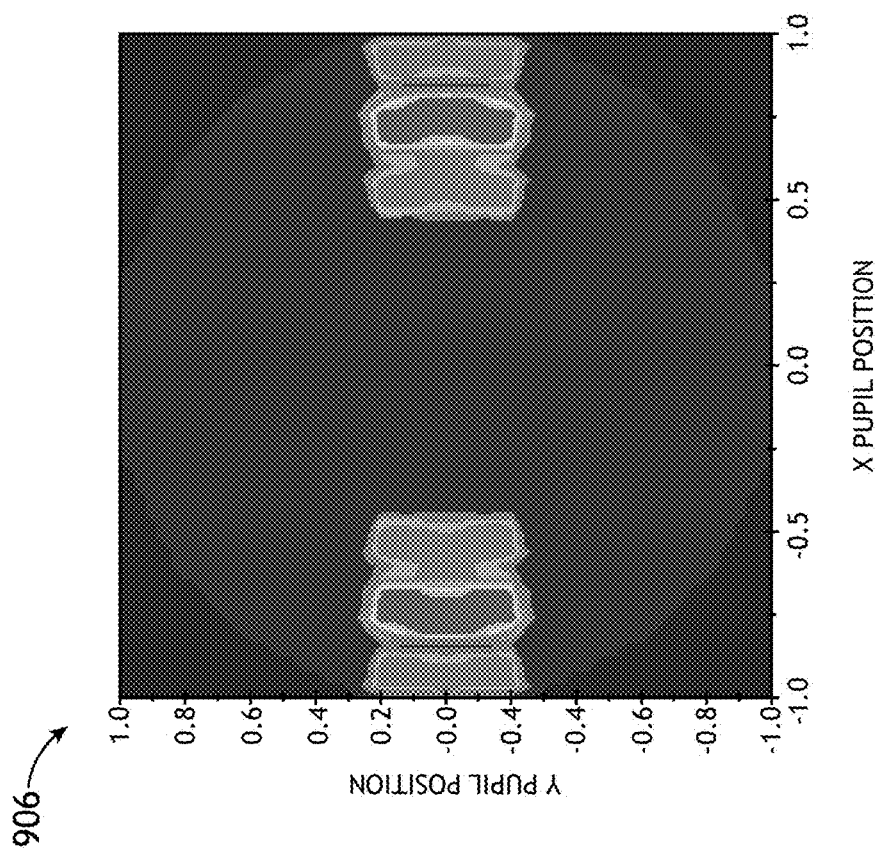
FIG. 9C is a plot 906 illustrating the diffraction pattern in a pupil plane of an exemplary layout of metrology target pattern elements, in accordance with one or more embodiments of the present disclosure.

FIGS. 8 through 9C correspond to an illustrative example of the performance of an exemplary set of device pattern elements and two exemplary layouts of metrology target pattern elements. In this example, a set of device structures illustrated in FIG. 3B to be fabricated is characterized by a device pitch 304 of 100 nm and a device critical dimension 306 of 50 nm. The corresponding device pattern elements 302, illustrated in FIG. 3A have a pitch equal to the device pitch 304 and a width equal to the device critical dimension 306. The illumination source is configured as illustrated in FIG. 4 as a dipole illumination source. In this example, the selected metrology target structures (e.g. as determined by step 208 and illustrated in FIG. 6) include a metrology target pitch 606 of 700 nm and a metrology target critical dimension 608 of 340 nm (e.g. with a space width of 360 nm).

FIG. 8 is a plot of PPE as a function of Zernike coefficients for the device pattern elements 302, a first exemplary layout of metrology target pattern elements, and a second exemplary layout of metrology target pattern elements, in accordance with one or more embodiments of the present disclosure. In this example, the first exemplary layout of metrology target pattern elements is illustrated in FIG. 7A and has a pitch equal to the metrology target pitch 606 with a pattern width equal to the metrology target critical dimension 608. The second exemplary layout of metrology target pattern elements is illustrated in FIG. 7B and has a fixed grid width equal to the device pitch 304 and a global pitch 710 equal to the metrology target pitch 606. As illustrated in FIG. 8, the second exemplary layout of metrology target pattern elements (e.g. having sub-resolution features) has a higher degree of correlation between PPE as a function of Zernike polynomial to the device pattern elements than the first exemplary layout of metrology target pattern elements. Further, the cost function as calculated by equation (2) of the second exemplary layout of metrology target pattern elements is 1.01 nm, compared to 2.43 nm for the first exemplary layout of metrology target pattern elements. In this regard, the second exemplary layout of metrology target pattern elements may react to time-changing aberrations in much the same way as the device pattern elements.

A similar correlation between the behavior of the device pattern elements and second exemplary layout of metrology target pattern elements is illustrated in FIGS. 9A through 9C. As previously described herein, a lithography step of a semiconductor process may include forming an aerial image of the pattern mask 118 on the sample 122 (e.g. to expose a resist layer 126, or the like). Further, the distribution of illumination in the pupil plane of the lithography sub-system 102 includes the diffracted orders of illumination collected by the set of projection optics 120 used to form the aerial image. Accordingly, the printing characteristics of a printed element may depend at least in part on the pupil-plane diffraction profile. In this regard, designing pattern mask features of a metrology target pattern mask to exhibit a diffraction pattern corresponding to the device pattern element diffraction pattern may provide similar printing characteristics for the metrology target and the printed device elements.

FIG. 9A is a plot 902 illustrating the diffraction pattern in a pupil plane (e.g. a pupil plane of the lithography system 102, or the like) for the device pattern elements, in accordance with one or more embodiments of the present disclosure. FIG. 9B is a plot 904 illustrating the diffraction pattern in a pupil plane for the first exemplary layout of metrology target pattern elements, in accordance with one or more embodiments of the present disclosure. FIG. 9C is a plot 906 illustrating the diffraction pattern in a pupil plane for the second exemplary layout of metrology target pattern elements, in accordance with one or more embodiments of the present disclosure. In one embodiment, the diffraction pattern 906 of the second exemplary layout of metrology target pattern elements more closely corresponds to the diffraction pattern 902 of the device pattern elements than the diffraction pattern 904 of the first exemplary layout of metrology target pattern elements. Accordingly, metrology target structures associated with an image of the second exemplary layout of metrology target pattern elements may provide a more accurate representation of the printing characteristics of device structures on the semiconductor layer than metrology target structures associated with an image of the first exemplary layout of metrology target pattern elements.

Referring again to FIGS. 1A through 1D, an illumination source (e.g. the illumination source 112, the metrology illumination source 128, or the like) may include any illumination source known in the art suitable for generating an illumination beam (e.g. illumination beam 114, metrology illumination beam 130, or the like). For example, the illumination source may include, but is not limited to, a monochromatic light source (e.g. a laser), a polychromatic light source with a spectrum including two or more discrete wavelengths, a broadband light source, or a wavelength-sweeping light source. Further, the illumination source may be, but is not required to be, formed from a white light source (e.g. a broadband light source with a spectrum including visible wavelengths), a laser source, a free-form illumination source, a single-pole illumination source, a multi-pole illumination source, an arc lamp, an electrodeless lamp, or a laser sustained plasma (LSP) source.

In another embodiment, the wavelengths of radiation of the one or more illumination beams emitted by the illumination source are tunable. In this regard, the wavelengths of radiation of the one or more illumination beams may be adjusted to any selected wavelength of radiation (e.g. UV radiation, visible radiation, infrared radiation, or the like).

The illumination source may also be configured to provide light having high brightness. For example, the illumination source may provide an illumination beam having a brightness greater than about 1 W/(nm cm$^2$ Sr). The system 100 may also include a fast feedback to the light source for stabilizing its power and wavelength. Output of the light source can be delivered via free-space propagation, or in some cases delivered via optical fiber or light guide of any type. Further, an illumination beam may be delivered via free-space propagation or guided light (e.g. an optical fiber, a light pipe, or the like).

It is further noted herein that, for the purposes of the present disclosure, an illumination pole of the illumination source (e.g. illumination source 112 of lithography sub-system 102) may represent illumination from a specific location of the illumination source. In this regard, each spatial location on an illumination source with respect to an optical axis 148 may be considered an illumination pole. Further, an illumination pole may have any shape or size known in the art. Additionally, a free-form illumination source may be considered to have an illumination profile corresponding to a distribution of illumination poles.

It is noted herein that the pattern mask 118 may be a reflective or a transmissive element. In one embodiment, the pattern mask 118 is a transmissive element in which pattern elements fully or partially block the transmission of an illumination beam 114 (e.g. through absorption or reflection of the illumination beam 104). Accordingly, the illumination beam 114 may be transmitted through spaces between pattern elements to the set of projection optics 120. For example, a pattern mask 118 in which pattern elements fully block the transmission of the illumination beam 114 may operate as a binary pattern mask. It is further recognized that focus-sensitive binary pattern masks in which light from an illumination source 112 is either fully blocked or fully transmitted/reflected to generate an image may be utilized to determine a focal position of a sample in a lithography sub-system 102. For example, binary pattern masks are relatively inexpensive to fabricate and may be readily incorporated into many lithography systems. In another embodiment, features of the pattern mask 118 (e.g. pattern elements, spaces between pattern elements, or the like) are designed to modify the optical phase of an illumination beam 114. In this regard, the pattern mask 118 may operate as a phase mask (e.g. an alternating phase shift mask, or the like).

In another embodiment, the pattern mask 118 is a reflective mask in which pattern mask elements fully or partially reflect an illumination beam 114 to the set of projection optics 120 and the spaces between pattern mask elements absorb or transmit the illumination beam 114. Further, pattern elements of the pattern mask 118 may be formed from any opaque or semi-opaque material known in the art for reflecting and/or absorbing an illumination beam 114. In another embodiment, the pattern mask elements may include a metal. For example, the pattern mask elements may be, but are not required to be, formed from chrome (e.g. a chrome alloy, or the like).

In this regard, the mask support device 116 may hold the pattern mask 118 utilizing any means known in the art, such as, but not limited to, a mechanical, vacuum, electrostatic or other clamping technique.

In another embodiment, the system 100 includes a sample stage 124 suitable for securing a sample 122. The sample stage 124 may include any sample stage architecture known in the art. For example, the sample stage 124 may include, but is not limited to, a linear stage. By way of another example, the stage assembly 118 may include, but is not limited to, a rotational stage. Further, the sample 122 may include a wafer, such as, but not limited to, a semiconductor wafer.

Figure 1D:
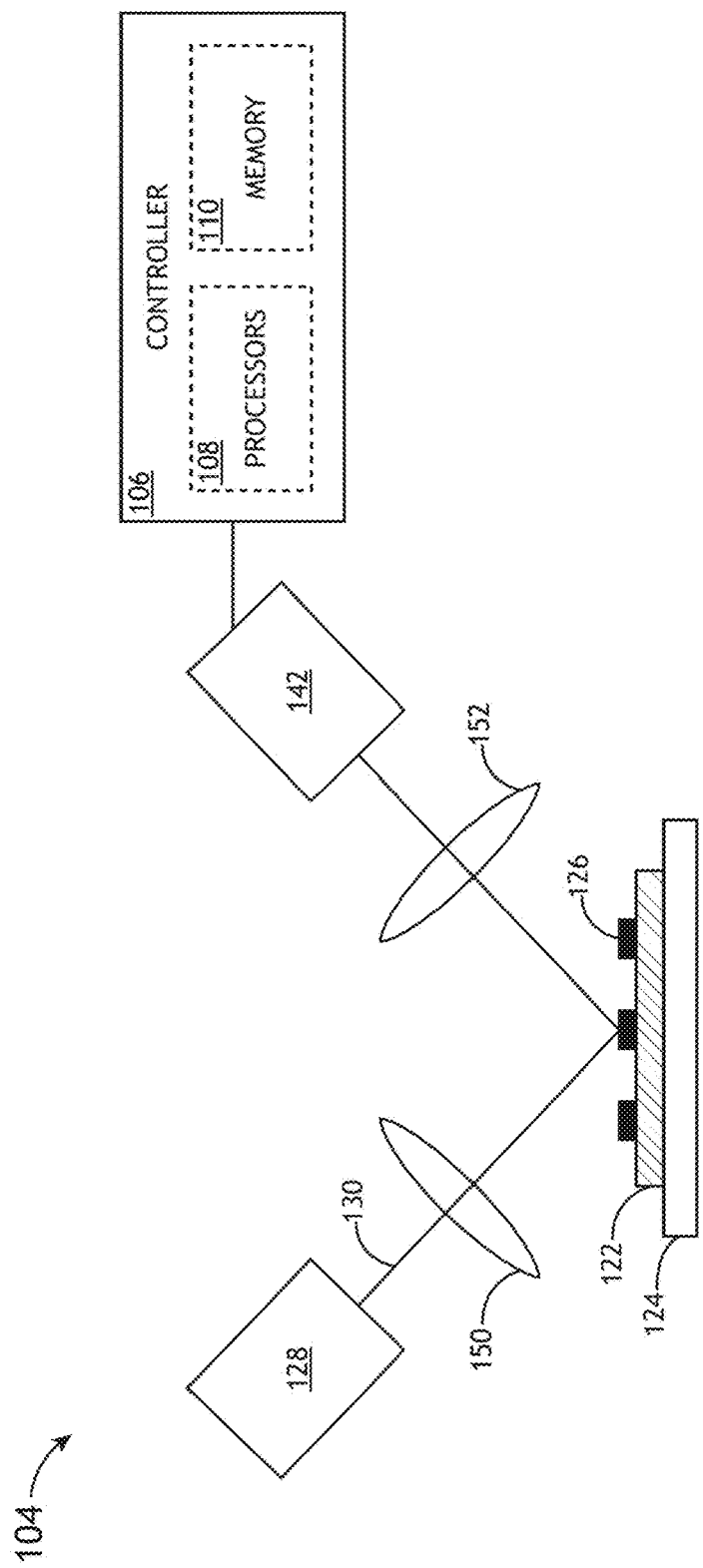
FIG. 1D is a conceptual view illustrating a metrology sub-system, in accordance with another embodiment of the present disclosure.

Referring to FIGS. 1C and 1D, embodiments of the present disclosure may incorporate any type of metrology system known in the art including, but not limited to, a spectroscopic ellipsometer with one or more angles of illumination, a spectroscopic ellipsometer for measuring Mueller matrix elements (e.g. using rotating compensators), a single-wavelength ellipsometer, an angle-resolved ellipsometer (e.g. a beam-profile ellipsometer), a spectroscopic reflectometer, a single-wavelength reflectometer, an angle-resolved reflectometer (e.g. a beam-profile reflectometer), an imaging system, a pupil imaging system, a spectral imaging system, or a scatterometer. Further, the metrology system may include a single metrology tool or multiple metrology tools. A metrology system incorporating multiple metrology tools is generally described in U.S. Pat. No. 7,478,019. Focused beam ellipsometry based on primarily reflective optics is generally described in U.S. Pat. No. 5,608,526, which is incorporated herein by reference in its entirety. The use of apodizers to mitigate the effects of optical diffraction causing the spread of the illumination spot beyond the size defined by geometric optics is generally described in U.S. Pat. No. 5,859,424, which is incorporated herein by reference in its entirety. The use of high-numerical-aperture tools with simultaneous multiple angle-of-incidence illumination is generally described by U.S. Pat. No. 6,429,943, which is incorporated herein by reference in its entirety.

It is further recognized herein that a metrology tool may measure characteristics of one or more targets such as, but not limited to, critical dimensions (CD), overlay, sidewall angles, film thicknesses, or process-related parameters (e.g. focus, dose, and the like). The targets may include certain regions of interest that are periodic in nature, such as for example gratings in a memory die. The metrology targets may further possess various spatial characteristics and are typically constructed of one or more cells which may include features in one or more layers which may have been printed in one or more lithographically distinct exposures. The targets or the cells may possess various symmetries such as two-fold or four-fold rotation symmetry, reflection symmetry. Examples of such metrology structures are described in U.S. Pat. No. 6,985,618, which is included herein by reference in its entirety. Different cells or combinations of cells may belong to distinct layers or exposure steps. The individual cells may comprise either isolated non-periodic features or alternately they may be constructed from one, two or three dimensional periodic structures or combinations of non-periodic and periodic structures. The periodic structures may be non-segmented or they may be constructed from finely segmented features which may at or close to the minimum design rule of the lithographic process used to print them.

Metrology targets may be collocated or in close proximity with dummification structures in the same layer or in a layer above, below or in between the layers of the metrology structures. Metrology targets may include multiple layers (e.g. films) whose thicknesses can be measured by the metrology tool. Further, a metrology tool may, but is not required to, measure the composition of one or more layers of a semiconductor stack or one or more defects on or within a sample. The use of a metrology tool to characterize non-periodic targets is generally described in U.S. Pat. No. 9,291,554, granted on Mar. 22, 2016, which is incorporated herein by reference in its entirety.

Metrology targets may include metrology target designs placed on the semiconductor wafer for further use in one or more semiconductor fabrication steps (e.g., alignment, overlay registration operations, and the like). Further, metrology targets may be located at multiple sites on the semiconductor wafer. For example, metrology targets may be located within scribe lines (e.g., between dies) and/or located in the die itself. Multiple metrology targets may be measured simultaneously or serially by the same or multiple metrology tools as described in U.S. Pat. No. 7,478,019, which is incorporated herein by reference in its entirety. Registration target design for managing both reticle grid error and wafer overlay is described generally in U.S. Pat. No. 7,408,642, issued on Aug. 5, 2008, which is incorporated herein by reference in its entirety. Simultaneously determining an overlay accuracy and pattern placement error is described generally in U.S. Pat. No. 7,667,842, issued on Feb. 23, 2010, which is incorporated herein by reference in its entirety. Overlay metrology solutions in a triple patterning scheme is generally described in Proc. SPIE Vol 9424, 94240E (2015), which is incorporated herein by reference in its entirety. Lithography-aware overlay metrology target design is described generally in Proc. SPIE 9778, 97781L (2016). Metrology target design (MTD) solutions for diagonally orientated DRAM layers are generally described in Proc. SPIE 9778, 97782R (2016). Highly sensitive focus monitoring techniques based on illumination and target co-optimization are described generally in Proc. SPIE 9778, 977826 (2016). Metrology target design for tilted device designs is described generally in PCT Application no. PCT/US16/28314, filed Apr. 19, 2016, which is incorporated herein by reference in its entirety.

In another embodiment, raw data generated by a metrology tool is analyzed by algorithms that do not include modeling, optimization and/or fitting (e.g. phase characterization, or the like). The use of symmetric target design in scatterometry overlay metrology is generally described in U.S. Patent Publication No. 2015/0204664, published on Jul. 23, 2015, which is incorporated herein by reference in its entirety. It is noted herein that computational algorithms performed by the controller may be, but are not required to be, tailored for metrology applications through the use of parallelization, distributed computation, load-balancing, multi-service support, design and implementation of computational hardware, or dynamic load optimization. Further, various implementations of algorithms may be, but are not required to be, performed by the controller (e.g. through firmware, software, or field-programmable gate arrays (FPGAs), and the like), or one or more programmable optical elements associated with the metrology tool. The use of process modeling is generally described in U.S. Patent Publication No. 2014/0172394, published on Jun. 19, 2014, which is incorporated herein by reference in its entirety.

In another embodiment, the angle of incidence of the metrology illumination beam 130 on the sample 122 is adjustable. For example, the path of the metrology illumination beam 130 through the beamsplitter 138 and the objective lens 140 may be adjusted to control the angle of incidence of the metrology illumination beam 130 on the sample 122. In this regard, the metrology illumination beam 130 may have a nominal path through the beamsplitter 138 and the objective lens 140 such that the metrology illumination beam 130 has a normal incidence angle on the sample 122. Further, the angle of incidence of the metrology illumination beam 130 on the sample 122 may be controlled by modifying the position and/or angle of the metrology illumination beam 130 on the beamsplitter 138 (e.g. by rotatable mirrors, a spatial light modulator, a free-form illumination source, or the like). In another embodiment, the metrology illumination source 128 directs the one or more metrology illumination beam 130 to the sample 122 at an angle (e.g. a glancing angle, a 45-degree angle, or the like).

In another embodiment, the controller 106 is communicatively coupled to the metrology illumination source 128 to direct the adjustment of the angle of incidence between the illumination beam 104 and the sample 122. In another embodiment, the controller 106 directs the metrology illumination source 128 to provide one or more selected wavelengths of illumination (e.g. in response to feedback). In a general sense, the controller 106 may be communicatively coupled with any element within the metrology sub-system 104.

FIG. 1D is a conceptual view illustrating a metrology sub-system 104, in accordance with another embodiment of the present disclosure. In one embodiment, the illumination pathway 132 and the collection pathway 144 contain separate elements. For example, the illumination pathway 132 may utilize a first focusing element 150 to focus the metrology illumination beam 130 onto the sample 122 and the collection pathway 144 may utilize a second focusing element 152 to collect radiation from the sample 122. In this regard, the numerical apertures of the first focusing element 150 and the second focusing element 152 may be different. Further, it is noted herein that the metrology sub-system 104 depicted in FIG. 1D may facilitate multi-angle illumination of the sample 122, and/or more than one metrology illumination source 128 (e.g. coupled to one or more additional detectors 142). In this regard, the metrology sub-system 104 depicted in FIG. 1D may perform multiple metrology measurements. In another embodiment, one or more optical components may be mounted to a rotatable arm (not shown) pivoting around the sample 122 such that the angle of incidence of the metrology illumination beam 130 on the sample 122 may be controlled by the position of the rotatable arm.

The one or more processors 108 of a controller 106 may include any processing element known in the art. In this sense, the one or more processors 108 may include any microprocessor-type device configured to execute algorithms and/or instructions. In one embodiment, the one or more processors 108 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 110. Further, the steps described throughout the present disclosure may be carried out by a single controller 106 or, alternatively, multiple controllers. Additionally, the controller 106 may include one or more controllers housed in a common housing or within multiple housings. In this way, any controller or combination of controllers may be separately packaged as a module suitable for integration into system 100. Further, the controller 106 may analyze data received from the detector 142 and feed the data to additional components within the metrology sub-system 104 or external to the system 100. Further, the program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory, a random access memory, a magnetic or optical memory device (e.g., disk), a magnetic tape, a solid state drive and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like). Therefore, the above description should not be interpreted as a limitation on the present invention but merely an illustration.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A lithography system, comprising:
    an illumination source;
    a pattern mask configured to be illuminated by the illumination source, the pattern mask including a device pattern mask area and a metrology target pattern mask area, wherein the device pattern mask area includes a set of device pattern elements distributed with a device pitch, wherein the metrology target pattern mask area includes a set of metrology target pattern elements; and
    an optical element configured to expose a sample with an image of the pattern mask for the fabrication of one or more printed device structures based on the set of device pattern elements and one or more printed metrology target structures based on the set of metrology target pattern elements, wherein the one or more printed metrology target structures include a set of metrology target elements distributed with a metrology target pitch different than the device pitch, wherein the metrology target pitch is determined via one or more simulations, wherein regions of the metrology target pattern mask area corresponding to the one or more printed metrology target structures include metrology target pattern elements separated by sub-resolution gaps smaller than a resolution of the optical element such that the sub-resolution gaps are not included on the one or more printed metrology target structures, wherein regions of the metrology target pattern mask area corresponding to spaces between the one or more printed metrology target structures include sub-resolution pattern elements having widths smaller than the resolution of the optical element such that the sub-resolution pattern elements are not included on the one or more printed metrology target structures.

2. The lithography pattern mask of claim 1, wherein one or more printing properties of the one or more printed metrology target structures correspond to one or more printing properties of the one or more printed device structures.

3. The lithography pattern mask of claim 2, wherein the one or more printing properties include:
    at least one of a relative position of the sample, a pattern placement error, a critical dimension, or a sidewall angle.

4. The lithography pattern mask of claim 1, wherein at least a portion of the sub-resolution gaps are distributed with the device pitch.

5. The lithography pattern mask of claim 1, wherein at least a portion of the sub-resolution pattern elements are distributed with the device pitch.

6. The lithography pattern mask of claim 1, wherein the metrology target structures comprise:
    at least a portion of an overlay metrology target.

7. The lithography pattern mask of claim 6, wherein the overlay metrology target comprises:
    an image-based overlay target.

8. The lithography pattern mask of claim 7, wherein the metrology target pitch is determined through the one or more simulations to provide a sensitivity to overlay performance metric within a desired tolerance value.

9. The lithography pattern mask of claim 6, wherein the overlay metrology target comprises:
    a scatterometry-based overlay target.

10. The lithography pattern mask of claim 9, wherein the metrology target pitch is determined through the one or more simulations to provide a diffraction efficiency performance metric within a desired tolerance value.

11. A lithography pattern mask, comprising:
    a device pattern mask area, wherein the device pattern mask area includes a set of device pattern elements distributed with a device pitch; and
    a metrology target pattern mask area, wherein the metrology target pattern mask area includes a set of metrology target pattern elements, wherein the device pattern mask area and the metrology target pattern mask area are configured to be illuminated by an illumination source and imaged by a set of optical elements onto a sample for the fabrication of one or more printed device structures and one or more metrology target structures, wherein the one or more printed metrology target structures include a set of metrology target elements distributed with a metrology target pitch, wherein the metrology target pitch is determined via one or more simulations, wherein regions of the metrology target pattern mask area corresponding to the one or more printed metrology target structures include metrology target pattern elements distributed with the device pitch separated by sub-resolution gaps smaller than a resolution of the set of optical elements such that the sub-resolution gaps are not included on the one or more printed metrology target structures, wherein regions of the metrology target pattern mask area corresponding to spaces between the one or more printed metrology target structures include sub-resolution pattern elements having a width smaller than the resolution of the set of optical elements such that the sub-resolution pattern elements are not included on the one or more printed metrology target structures.

12. The lithography pattern mask of claim 11, wherein one or more printing properties of the one or more printed metrology target structures correspond to one or more printing properties of the one or more printed device structures.

13. The lithography pattern mask of claim 12, wherein the one or more printing properties include:
    at least one of a relative position of the sample, a pattern placement error, a critical dimension, or a sidewall angle.

14. The lithography pattern mask of claim 11, wherein the metrology target structures comprise:
   at least a portion of an overlay metrology target.

15. The lithography pattern mask of claim 14, wherein the overlay metrology target comprises:
   an image-based overlay target.

16. The lithography pattern mask of claim 15, wherein the metrology target pitch is determined through the one or more simulations to provide a sensitivity to overlay performance metric within a desired tolerance value.

17. The lithography pattern mask of claim 14, wherein the overlay metrology target comprises:
   a scatterometry-based overlay target.

18. The lithography pattern mask of claim 17, wherein the metrology target pitch is determined through the one or more simulations to provide a diffraction efficiency performance metric within a desired tolerance value.

* * * * *